(12) United States Patent
Chen et al.

(10) Patent No.: US 8,277,072 B2
(45) Date of Patent: Oct. 2, 2012

(54) MULTI-FUNCTION SOLAR-POWERED LIGHTING SYSTEM

(75) Inventors: Ruei-Tang Chen, Tainan (TW); Gan-Lin Hwang, Tainan (TW); Rong-Chang Lin, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 238 days.

(21) Appl. No.: 12/775,082

(22) Filed: May 6, 2010

(65) Prior Publication Data

US 2010/0281721 A1 Nov. 11, 2010

Related U.S. Application Data

(60) Provisional application No. 61/176,040, filed on May 6, 2009.

(51) Int. Cl.
F21L 4/00 (2006.01)

(52) U.S. Cl. .................... 362/183; 40/541

(58) Field of Classification Search .................. 362/183; 40/541
See application file for complete search history.

(56) References Cited

U.S. PATENT DOCUMENTS

| | | | |
|---|---|---|---|
| 3,696,294 A | 10/1972 | Krupka | |
| 4,144,097 A | 3/1979 | Chambers et al. | |
| RE30,043 E | 7/1979 | Moncrieff-Yeates | |
| 4,193,819 A | 3/1980 | Wohlmut | |
| 4,311,869 A | 1/1982 | Kurth et al. | |
| 5,076,674 A | 12/1991 | Lynam | |
| 7,731,383 B2* | 6/2010 | Myer | 362/145 |
| 2004/0245900 A1 | 12/2004 | Parkkinen | |
| 2005/0146874 A1 | 7/2005 | Cech et al. | |
| 2006/0050528 A1* | 3/2006 | Lyons et al. | 362/559 |
| 2006/0180200 A1 | 8/2006 | Platzer Bjorkman et al. | |
| 2006/0262522 A1 | 11/2006 | Allsop et al. | |
| 2009/0021210 A1* | 1/2009 | Korall et al. | 320/101 |
| 2009/0126792 A1* | 5/2009 | Gruhlke et al. | 136/259 |
| 2010/0108056 A1* | 5/2010 | Lin et al. | 126/684 |
| 2010/0282296 A1 | 11/2010 | Chen et al. | |

FOREIGN PATENT DOCUMENTS

| | | |
|---|---|---|
| CN | 2872525 Y | 2/2007 |
| JP | S61-136559 | 8/1986 |
| JP | H07-131051 | 5/1995 |
| JP | H11-027968 | 1/1999 |
| JP | 11-046008 | 2/1999 |
| JP | 11-340493 | 12/1999 |
| JP | 2000221279 | 8/2000 |
| JP | 2002351365 A | 12/2002 |

(Continued)

OTHER PUBLICATIONS

China Patent Office, Office Action, Application Serial No. 201010174084.2, Jul. 26, 2011, China.

(Continued)

*Primary Examiner* — Evan Dzierzynski

(57) ABSTRACT

A solar-powered lighting system includes a substrate, wherein at least one solar chip is disposed on one lateral side of the substrate, and at least one light source is disposed on one lateral side of the substrate. Solar light enters the substrate and propagates therein. Solar light energy is collected by the at least one solar chip which transforms the solar light energy into electrical power for the at least one light source to emit light to the substrate, before propagating therein and leaving the substrate.

27 Claims, 11 Drawing Sheets

FOREIGN PATENT DOCUMENTS

| | | |
|---|---|---|
| JP | 2003-218378 | 7/2003 |
| JP | 2006040950 | 2/2006 |
| JP | 2006107861 A | 4/2006 |
| JP | 2007-218540 | 8/2007 |
| TW | 200742912 | 11/2007 |
| TW | M356985 | 5/2009 |
| TW | 201001735 A1 | 1/2010 |
| WO | WO2008016978 * | 2/2008 |
| WO | WO 2009/101391 A2 | 8/2009 |

OTHER PUBLICATIONS

Japan Patent Office, Office Action, Patent Application Serial No. 2010-103474, May 29, 2012, Japan.
Peter A. Lewis "Pigment Handbook vol. I: Properties and Economics, 2nd Edition", John Wiley & Sons, New York, pp. 1-3 (1998).
US Patent Office, Office Action, U.S. Appl. No. 12/626,896, Jan. 31, 2012, US.

* cited by examiner

MULTI-FUNCTION SOLAR-POWERED LIGHTING SYSTEM

CROSS REFERENCE TO RELATED APPLICATIONS

This application claims the benefit of U.S. Provisional Application No. 61/176,040, filed on May 6, 2009.

BACKGROUND

1. Field of the Invention

The invention relates to a multifunction solar-powered lighting system, and in particular relates to a multifunction solar-powered lighting system, wherein solar light is guided to solar chips by a substrate to generate electrical power which is provided to a light source to emit light to the substrate.

2. Description of the Related Art

A conventional solar-powered signboard is shown in FIG. 1. A solar chip module 7 is disposed above the signboard 5. During the day, solar light enters the solar board 7 to generate electrical power. The electrical power is provided to a light source 9 at night. In such a structure, however, the solar chip module 7 and the signboard 5 must be separated, which may hinder design and appearance of the signboard.

SUMMARY

An embodiment of a solar-powered lighting system of the invention comprises a substrate, wherein at least one solar chip disposed on one lateral side of the substrate, and at least one light source disposed on one lateral side of the substrate. Solar light enters the substrate, and is propagated therein, so that solar light energy may be collected by the at least one solar chip to transform the solar light energy into electrical power for the at least one light source to emit light to enter the substrate, propagate therein and leave the substrate.

Preferably, the at least one light source comprises at least one light emitting diode.

Preferably, the substrate comprises at least one light diffusion layer and a plurality of light guiding layers adjacent to the light diffusion layer. Solar light enters the substrate and is diffused by the light diffusion layer. The diffused solar light is reflected by an interface of the light diffusion layer and the light guiding layer to be collected by the at least one solar chip. A portion of the solar light enters the light guiding layers and is reflected by the interface of the light guiding layers, and the reflected light is collected by the at least one solar chip. The light emitted from the light source is emitted to the substrate and is guided by the light diffusion layer and the light guiding layers to leave the substrate.

Preferably, the light diffusion layer has a haze of 5~99.

The light guiding layers are preferably made of acrylic material, polycarbonate, polyethylene terephthalate, polyurethane, polyimide, silicon resin or glass.

The light diffusion layer is preferably made of acrylic material, polycarbonate, polyethylene terephthalate, polyurethane, polyimide or silicon resin.

Preferably, the light diffusion layer comprises light scattering particles.

Preferably, the light diffusion layer comprises a mixed material of two materials with different index of refractions.

Preferably, the light diffusion layer is an optical composite structure.

The solar-powered lighting system of the invention further comprises a power accumulator connected to the at least one solar chip and the at least one light source. The electrical power generated by the at least one solar chip is saved in the power accumulator, and the saved electrical power is provided to the at least one light source.

The substrate has a first surface and a second surface opposite to the first surface, and solar light passes through the first surface to enter the substrate and the emitted light from the at least one light source passes through the first surface to leave the substrate.

The solar-powered lighting system of the invention further comprises a pattern layer disposed in the substrate, on the first surface of the substrate or on the second surface of the substrate, wherein the light from the at least one light source is emitted to the pattern layer, before leaving the substrate.

A detailed description is given in the following embodiments with reference to the accompanying drawings.

BRIEF DESCRIPTION OF DRAWINGS

The present invention can be more fully understood by reading the subsequent detailed description and examples with references made to the accompanying drawings, wherein:

FIGS. 2a and 2b depict an embodiment of a solar-powered lighting system of the invention, wherein FIG. 2a is an exploded view, and FIG. 2b is a assembled view;

FIGS. 3a and 3b depict another embodiment of a solar-powered lighting system of the invention, wherein FIG. 3a is an exploded view, and FIG. 3b is a assembled view;

DETAILED DESCRIPTION OF INVENTION

Referring to FIGS. 2a, 2b, 3a and 3b, a solar-powered lighting system comprises a substrate 100 which has a multi-layer structure. The detailed structure of the substrate 100 is described in the following paragraphs.

Figure 1:
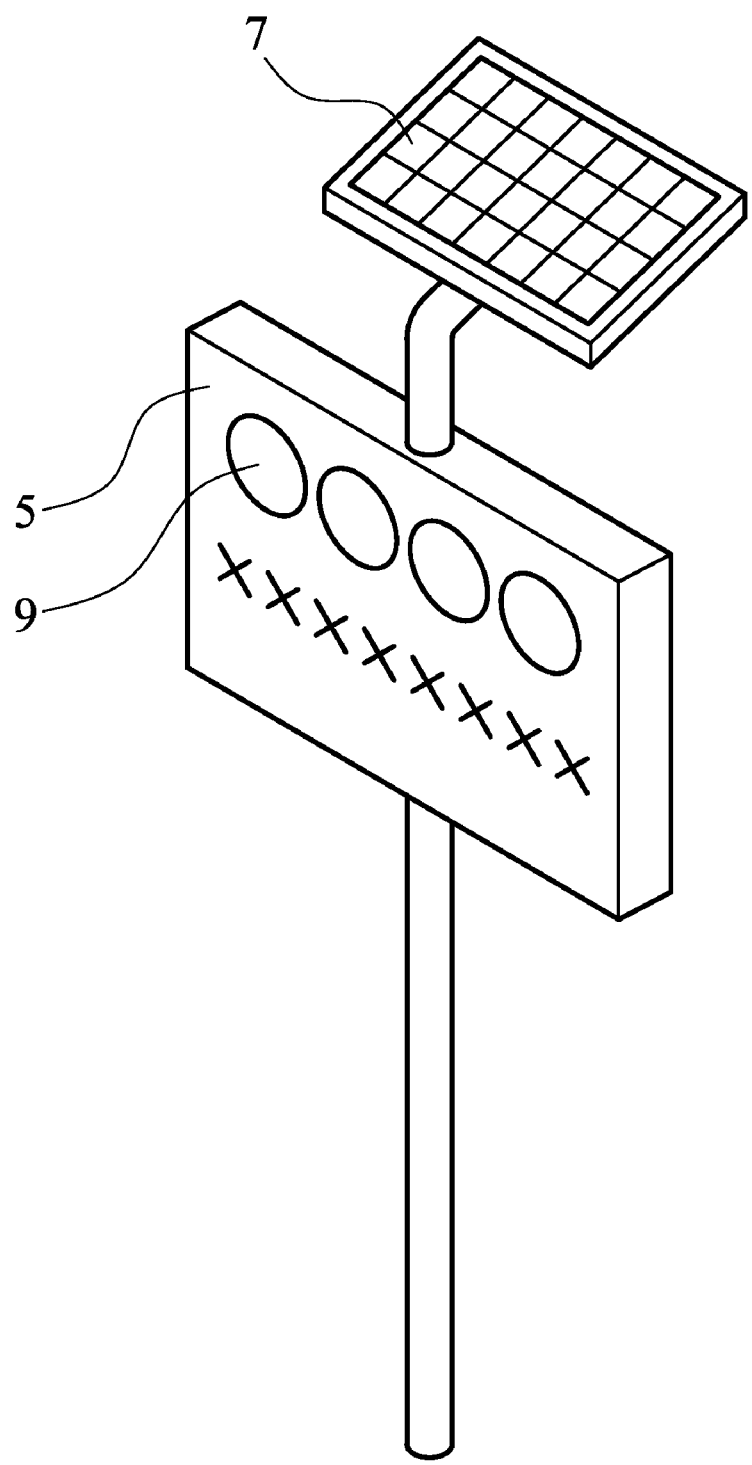
FIG. 1 is a schematic view of a conventional solar-powered signboard.
Figure 2A:
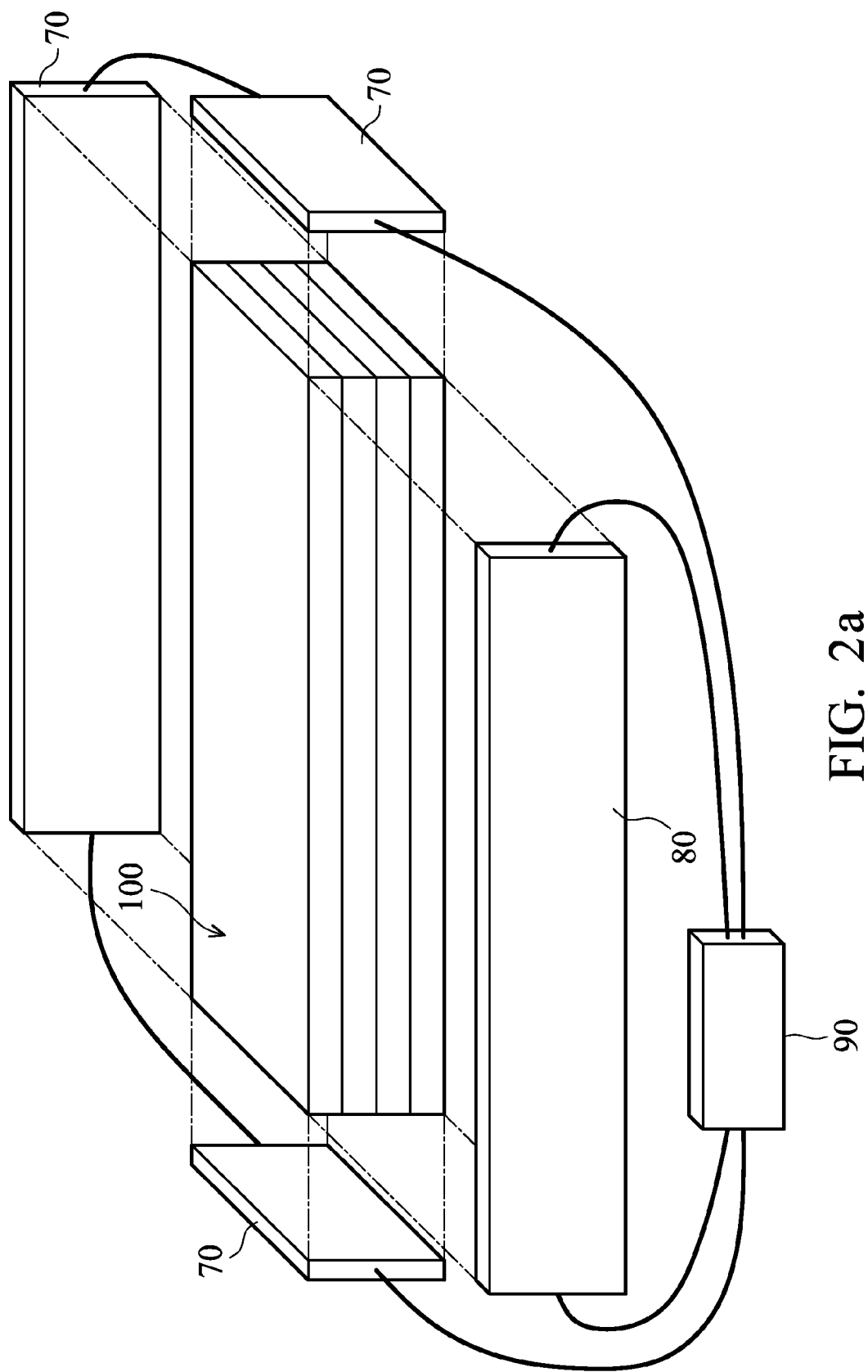
Figure 2B:
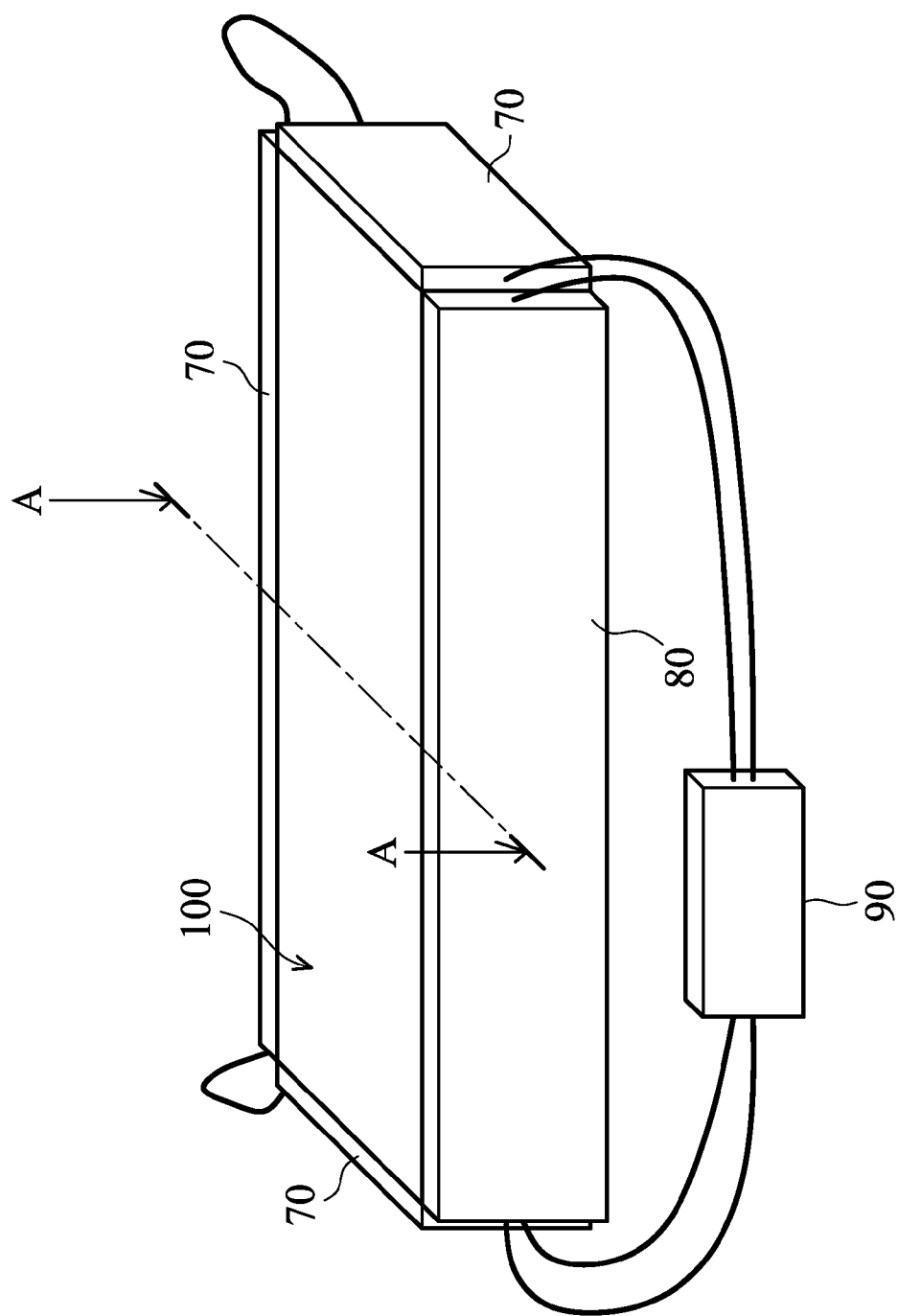

In FIGS. 2a and 2b, three solar chips 70 are disposed on three adjacent lateral surface of the substrate 100. The solar chips 70 are serially connected and connected to a power accumulator 90. A light source 80 is disposed on the other lateral surface of the substrate 100. The light source 80 is a light emitting diode in this embodiment.

When the substrate 100 is disposed outdoors as a signboard, during the day, solar light enters the substrate 100, and propagates in the substrate 100 having the multi-layer structure, so that solar light energy may be collected by the solar chips 70. Solar light energy is transformed into electrical power which is saved in a power accumulator 90 connected to the at least one light source 80. At night, the power accumulator 90 provides electrical power for the at least one light source 80 to emit light. The light from the at least one light source 80 enters the substrate 100 and is emitted to a pattern or text (not shown) in or on the substrate 100, and then is guided by the multi-layer structure of the substrate 100 to leave the substrate 100, which makes the pattern or text visible at night.

Figure 3A:
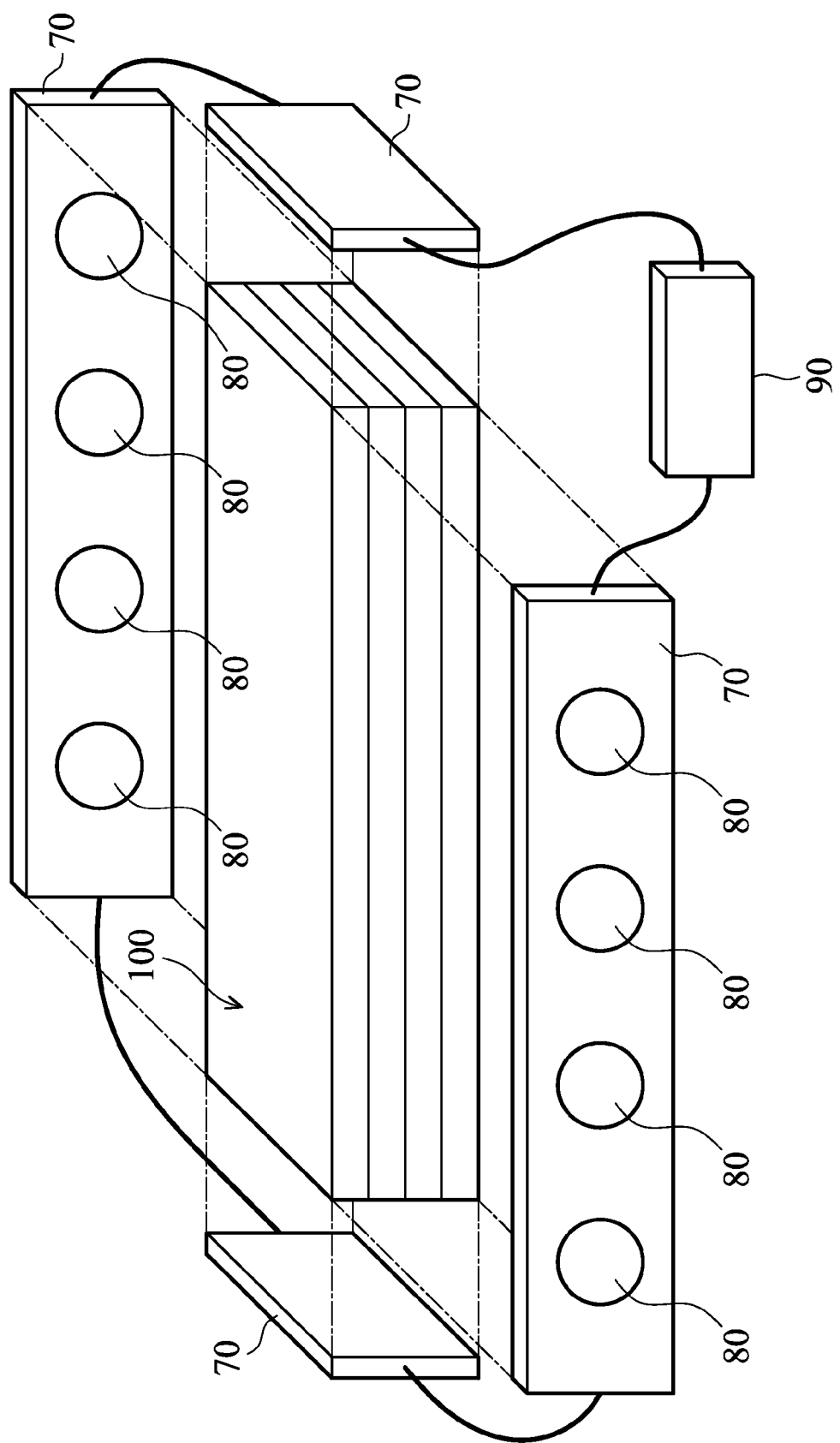
Figure 3B:
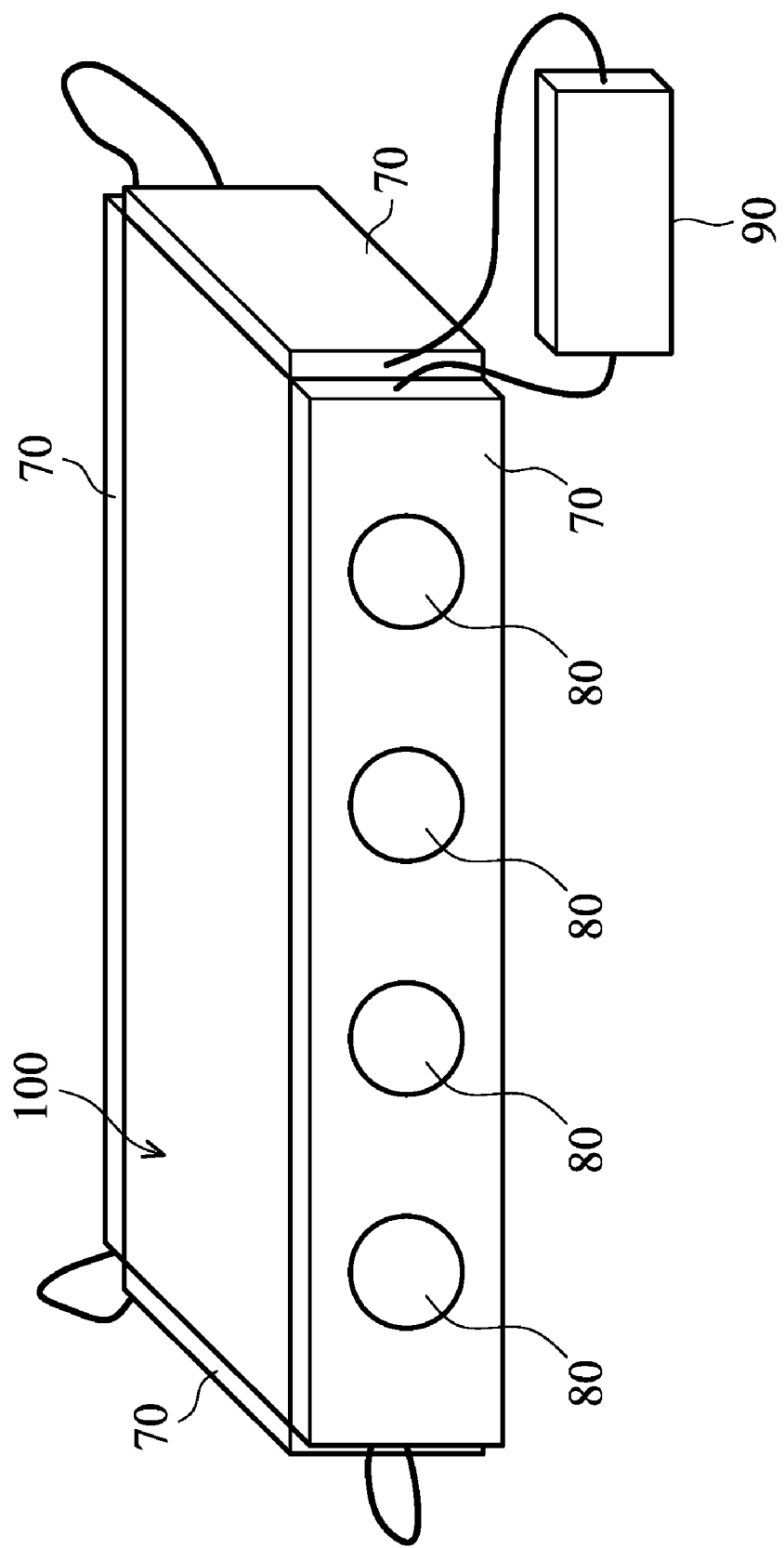

Referring to FIGS. 3a and 3b, four solar chips 70 are disposed on four lateral surface of the substrate 100. Light sources 80 (light emitting diodes) are joined to the at least one solar chips 70 which are serially connected to a power accumulator 90. The at least one solar chips 70 can be arranged in one row or two rows. If the capacity of the accumulator 90 is small or the area of the substrate 100 is small, only one row of solar chips 70 is needed. Solar light enters the substrate 100, and propagates in the substrate 100, so that solar light energy may be collected by the solar chips 70. Solar light energy is transformed into electrical power which is saved in a power accumulator 90 connected to the light source 80. At night, the power accumulator 90 provides electrical power for the light source 80 to emit light. The light from the light source 80 enters the substrate 100 and is emitted to a pattern or text (not shown) in or on the substrate 100, and then is guided by the multi-layer structure of the substrate 100 to leave the substrate 100, which makes the pattern or text visible at night.

Figure 4:
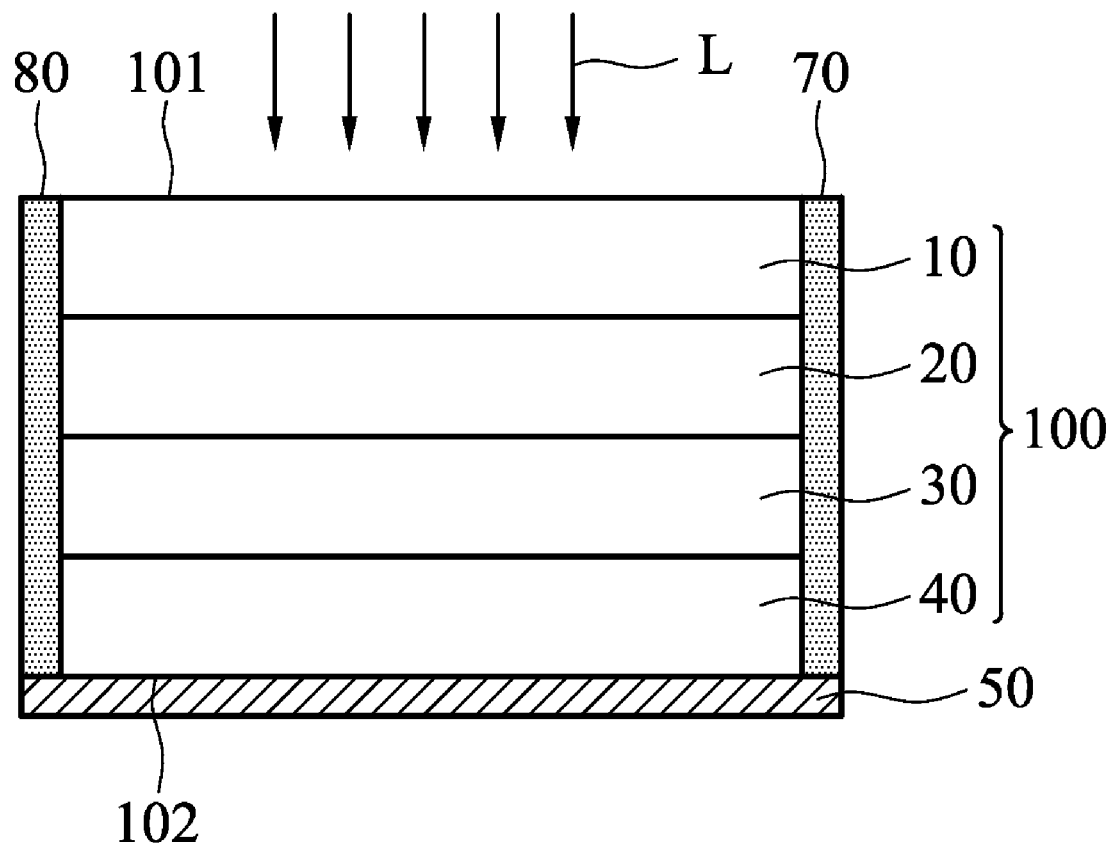
FIG. 4 is a cross section view along line A-A of FIG. 2b.
Figure 5:
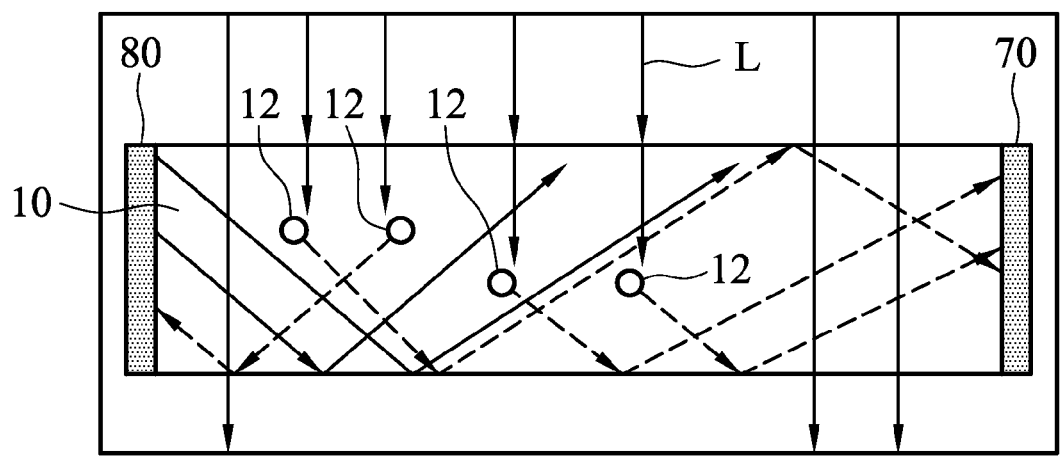
FIG. 5 depicts a light diffusion layer of the solar-powered lighting system of the invention.
Figure 6:
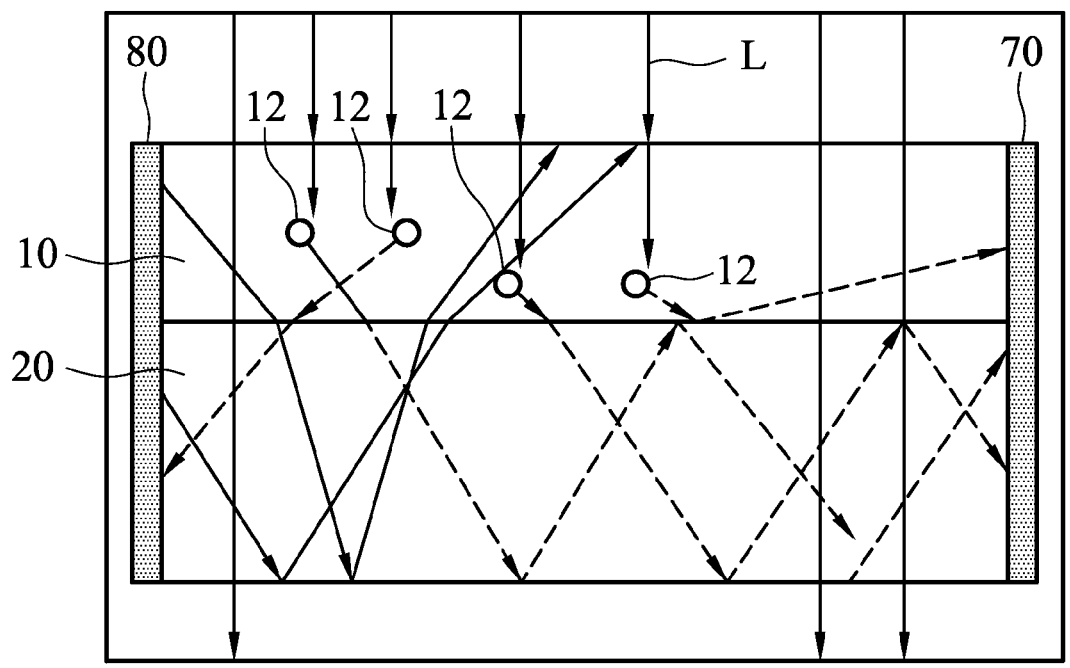
FIG. 6 depicts solar light being guided by a light diffusion layer and a light guiding layer.

Referring to FIG. 4, the solar-powered lighting system comprises a substrate 100, wherein solar chips 70 are disposed on one lateral surface of the substrate 100, and light sources 80 are disposed on another lateral surface of the substrate 100. The substrate 100 comprises a first surface 101 and a second surface 102 opposite to the first surface 101. Solar light passes through the first surface 101 to enter the substrate 100. Light from the at least one light source 80 also passes through the first surface 101 to leave the substrate 100. The lateral surfaces, on which the solar chips 70 and light sources 80 are respectively disposed, are perpendicular to the first and second surfaces 101 and 102.

In this embodiment, a pattern layer 50 is disposed on the second surface 102. A desired pattern or text is formed on the pattern layer 50. Light from the light source 80 is emitted to the pattern layer 50 and is reflected by the pattern layer 50 to make the pattern or text visible. Although the pattern layer 50 is disposed on the second surface 102 in this embodiment, the pattern layer 50 may also be disposed on the first surface 101 or in the substrate 100. When the pattern layer 50 is disposed on the first surface 101 or in the substrate 100, the pattern or text of the pattern layer 50 covers a portion of the first surface 101 to allow solar light to enter the substrate 100.

A detailed structure of the substrate 100 will now be described. The substrate 100 comprises a light diffusion layer 10 and light guiding layers 20, 30 and 40. Solar light L enters the light diffusion layer 10. FIG. 2 depicts a more detailed structure of the light diffusion layer 10. Light scattering particles 12 are distributed in the light diffusion layer 10. When solar light L enters the light diffusion layer 10, solar light is scattered by the light scattering particles 12. The scattered light is reflected by the interface of the light diffusion layer 10 so that solar light energy may be collected by the solar chips 70. The particles 12 are preferably transparent but have different index of refractions from the material of the light diffusion layer 10.

A portion of the solar light L penetrates the light diffusion layer 10 to enter the light guiding layer 20 as shown in FIG. 3. Since the index of refraction of the light diffusion layer 10 is different from the light guiding layers 20, 30 and 40, the solar light is refracted when the solar light enters the light guiding layer 20, and the refracted light is reflected by the interface of the light guiding layer 20 so that solar light energy may be collected by the solar chips 70.

The light guiding layers 20, 30 and 40 are made of acrylic material, polycarbonate, polyethylene terephthalate, polyurethane, polyimide, silicon resin or glass. The light diffusion layer is made of acrylic material, polycarbonate, polyethylene terephthalate, polyurethane, polyimide or silicon resin.

The solar chips can be III-V column solar chips, single crystal silicon solar chips, poly crystal silicon solar chips or CIGS solar chips.

The solar-powered lighting system of the invention has many applications, some of which are illustrated in Table 1.

TABLE 1

| Effeteness | Substrate Haze | Application Category |
|---|---|---|
| Excellent | 80~99 | Windows, Skylights, Warning Devices |
| High | 60~80 | Windows, French Windows, Signboards, Warning Devices, Art Glass |
| Medium | 40~60 | Skylights, French Windows, Signboards, Route Marks, Art Glass |
| Low | 20~40 | French Windows, Signboards, Flat Display Devices, Route Marks, Art Glass |
| Very Low | 5~20 | French Windows, Signboards, Flat Display Devices, Art Glass, Planar Light Sources |

A suitable application for high haze substrates may be warning devices, whereas a suitable application for low haze substrates may be planar light sources or flat display devices.

Figure 7A:
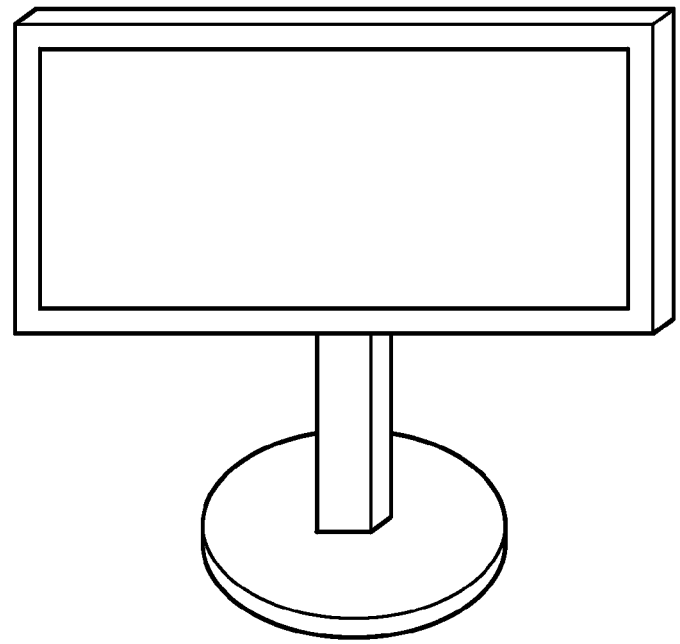
FIGS. 7a and 7b depict an application of the solar-powered lighting system.
Figure 7B:
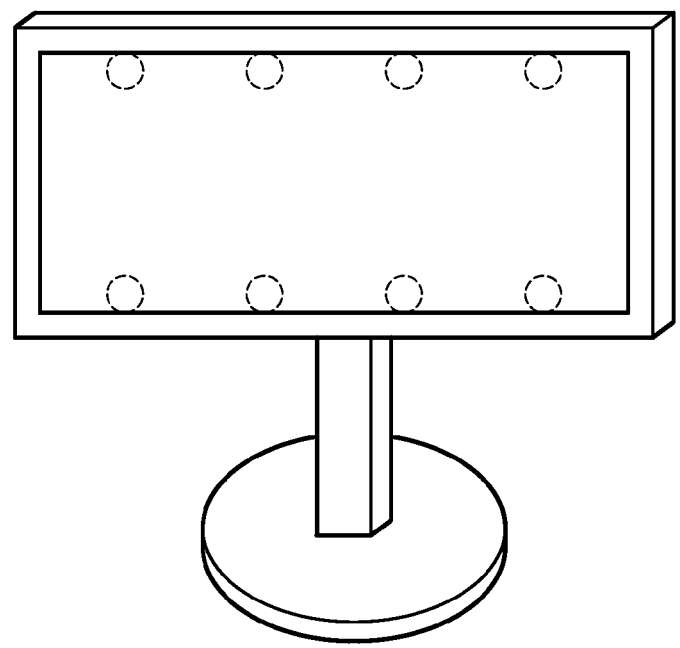

FIGS. 7a and 7b illustrate the solar-powered lighting system of the invention being applied to a signboard. FIG. 7a illustrates the light source being turned off; FIG. 7b illustrates the light source being turned on. The substrate comprises light diffusion plates having a haze of 31, a length of 445 mm, a width of 235 mm, a thickness of 3 mm and two glass plates with a thickness of 5 mm. Sixteen solar chips and eight LEDs with 0.1 W of power are disposed around the substrate. The electrical power generated by the solar-powered lighting system is 1.14 W. It is noticed, that the pattern layer (pattern and text) is formed in the first surface.

Figure 8A:
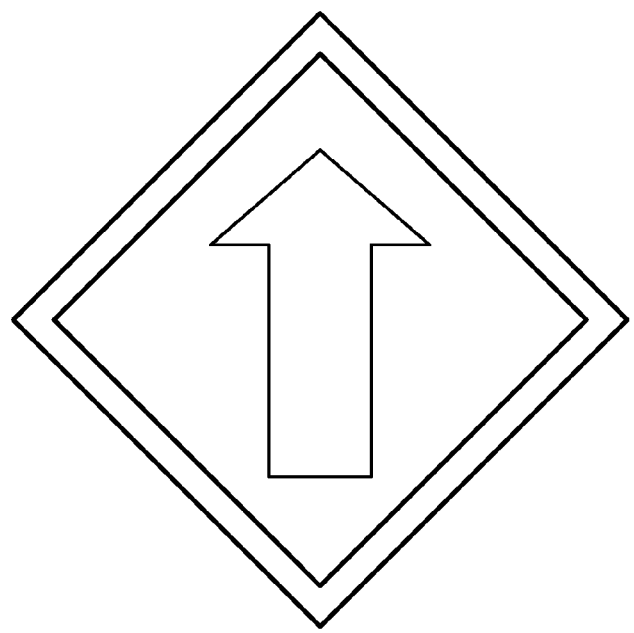
FIGS. 8a and 8b depict another application of the solar-powered lighting system.
Figure 8B:
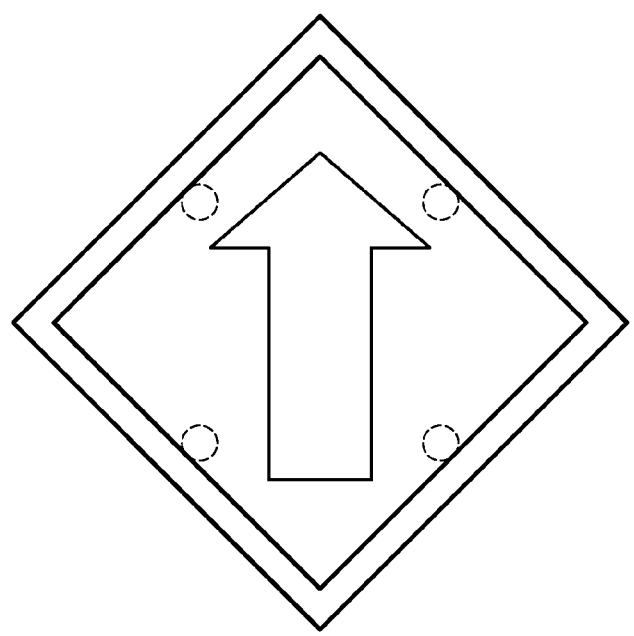

FIGS. 8a and 8b illustrate the solar-powered lighting system of the invention being applied to a traffic sign. FIG. 8a illustrates the light source being turned off; FIG. 8b illustrates the light source being turned on. The substrate comprises a PC light diffusion plate having a haze of 41, a length of 95 mm, a width of 95 mm, a thickness of 3 mm and two glass plates with a thickness of 5 mm. Eight solar chips and four LEDs with 0.05 W of power are disposed around the substrate. The electrical power generated by the solar-powered lighting system is 0.16 W. It is noted, that the pattern layer (pattern and text) is formed in the first surface.

Figure 9A:
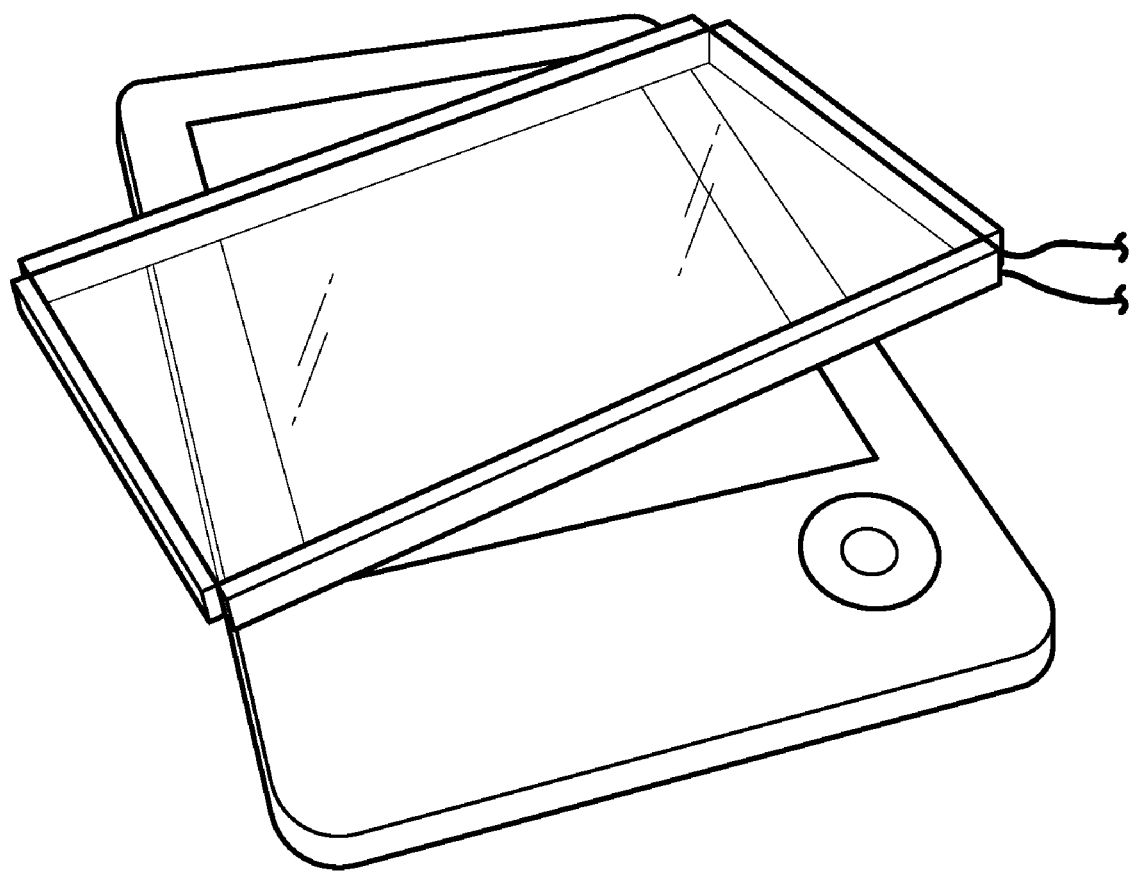
FIGS. 9a and 9b depict another application of the solar-powered lighting system.
Figure 9B:
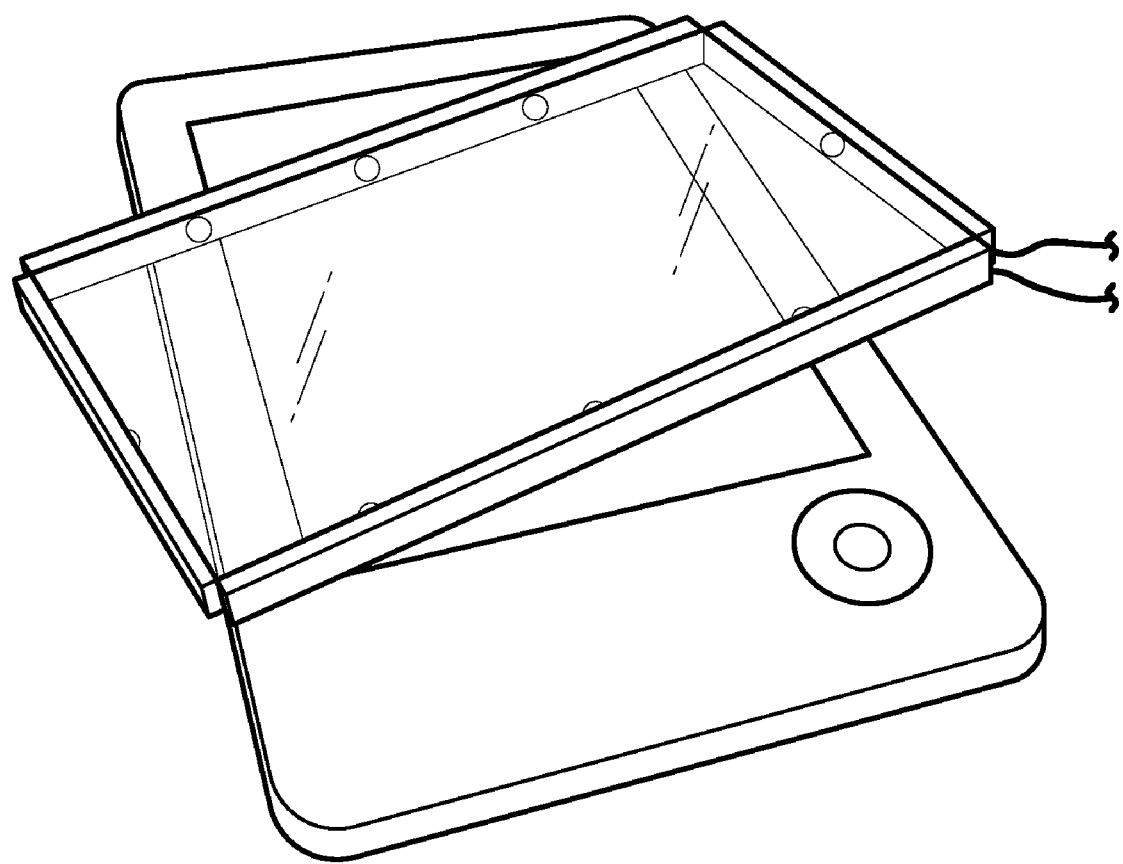

FIGS. 9a and 9b illustrate the solar-powered lighting system of the invention being applied to an electronic book. FIG. 9a illustrates the light source being turned off; FIG. 9b illustrates the light source being turned on. The substrate comprises a PC light diffusion plate having a haze of 14, a length of 155 mm, a width of 85 mm, a thickness of 3 mm and two glass plates with a thickness of 5 mm. Eight solar chips and eight LEDs with 0.05 W of power are disposed around the substrate. The electrical power generated by the solar-powered lighting system is 0.04 W. It is noted that the pattern layer (pattern and text) is formed in the first surface.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A solar-powered lighting system, comprising:
   a substrate comprising at least one light diffusion layer and a plurality of light guiding layers adjacent to the light diffusion layer;
   at least one solar chip disposed on at least one lateral surface of the substrate; and
   at least one light source disposed on at least one lateral surface of the substrate, wherein electrical power for the at least one light source to emit light is generated by the at least one solar chip collecting solar light energy from solar light entering the substrate and propagating therein,
   wherein solar light enters the substrate and is diffused by the light diffusion layer, and the diffused solar light is reflected by an interface of the light diffusion layer and the light guiding layer for solar light energy collection by the at least one solar chips, and a portion of the solar light enters the light guiding layers and is reflected by the interface of the light guiding layers,
   wherein the solar light energy of the reflected light is collected by the at least one solar chips, and
   wherein the light emitted from the light source is emitted to the substrate and is guided by the light diffusion layer and the light guiding layers to leave the substrate.

2. The solar-powered lighting system as claimed in claim 1, wherein the at least one light source comprises at least one light emitting diode.

3. The solar-powered lighting system as claimed in claim 1, wherein the light diffusion layer has a haze of 5~99.

4. The solar-powered lighting system as claimed in claim 1, wherein the light guiding layers are made of acrylic material, polycarbonate, polyethylene terephthalate, polyurethane, polyimide, silicon resin or glass.

5. The solar-powered lighting system as claimed in claim 1, wherein the light diffusion layer is made of acrylic material, polycarbonate, polyethylene terephthalate, polyurethane, polyimide or silicon resin.

6. The solar-powered lighting system as claimed in claim 1, wherein the light diffusion layer comprises light scattering particles.

7. The solar-powered lighting system as claimed in claim 1, wherein the light diffusion layer comprises a mixed material of two materials with different index of refractions.

8. The solar-powered lighting system as claimed in claim 1, wherein the light diffusion layer is an optical composite structure.

9. The solar-powered lighting system as claimed in claim 1 further comprising a power accumulator connected to the at least one solar chip and the at least one light source, wherein the electrical power generated by the at least one solar chip is saved in the power accumulator, and the saved electrical power is provided to the at least one light source.

10. The solar-powered lighting system as claimed in claim 9, wherein the power accumulator comprises a battery.

11. The solar-powered lighting system as claimed in claim 1, wherein the substrate has a first surface and a second surface opposite to the first surface, and solar light passes through the first surface to enter the substrate and the light from the at least one light source passes through the first surface to leave the substrate.

12. The solar-powered lighting system as claimed in claim 11 further comprising a pattern layer disposed in the substrate, on the first surface of the substrate or on the second surface of the substrate, wherein the light from the at least one light source is emitted to the pattern layer before leaving the substrate.

13. The solar-powered lighting system as claimed in claim 11, wherein the lateral surface of the substrate is adjacent to the first surface and the second surface of the substrate.

14. The solar-powered lighting system as claimed in claim 13, wherein the lateral surface of the substrate is perpendicular to the first surface and the second surface of the substrate.

15. A signboard comprising the solar-powered light system as claimed in claim 1.

16. A warning device comprising the solar-powered light system as claimed in claim 1.

17. A planar light source comprising the solar-powered light system as claimed in claim 1.

18. A display device comprising the solar-powered light system as claimed in claim 1.

19. The solar-powered lighting system as claimed in claim 1, wherein the at least one solar chips are disposed around the substrate.

20. The solar-powered lighting system as claimed in claim 1, wherein the at least one light source is disposed on at least one of the at least one solar chips.

21. A solar-powered lighting system, comprising:
   a substrate;
   at least one solar chip disposed on at least one lateral surface of the substrate; and
   at least one light source disposed on at least one lateral surface of the substrate, wherein electrical power for the at least one light source to emit light is generated by the at least one solar chip collecting solar light energy from solar light entering the substrate and propagating therein;
   wherein the substrate has a first surface and a second surface opposite to the first surface, and solar light passes through the first surface to enter the substrate and the light from the at least one light source passes through the first surface to leave the substrate.

22. The solar-powered lighting system as claimed in claim 21, wherein the at least one light source comprises at least one light emitting diode.

23. The solar-powered lighting system as claimed in claim 21 further comprising a power accumulator connected to the at least one solar chip and the at least one light source, wherein the electrical power generated by the at least one solar chip is saved in the power accumulator, and the saved electrical power is provided to the at least one light source.

24. The solar-powered lighting system as claimed in claim 23, wherein the power accumulator comprises a battery.

25. The solar-powered lighting system as claimed in claim 21 further comprising a pattern layer disposed in the substrate, on the first surface of the substrate or on the second surface of the substrate, wherein the light from the at least one light source is emitted to the pattern layer before leaving the substrate.

26. The solar-powered lighting system as claimed in claim 21, wherein the lateral surface of the substrate is adjacent to the first surface and the second surface of the substrate.

27. The solar-powered lighting system as claimed in claim 26, wherein the lateral surface of the substrate is perpendicular to the first surface and the second surface of the substrate.

* * * * *